Figure 1:
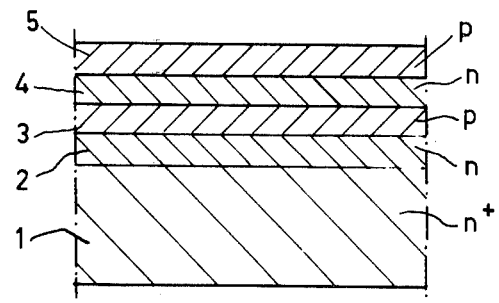

United States Patent [19]

Lebailly et al.

[11] 4,035,205

[45] July 12, 1977

[54] AMPHOTERIC HETEROJUNCTION

[75] Inventors: Jacques Lebailly; Daniel Diguet, both of Caen, France

[73] Assignee: U.S. Philips Corporation, New York, N.Y.

[21] Appl. No.: 639,900

[22] Filed: Dec. 11, 1975

[30] Foreign Application Priority Data

Dec. 24, 1974 France .............................. 74.42664

[51] Int. Cl.² ...................................... H01L 21/208
[52] U.S. Cl. .................................. 148/171; 148/33; 148/33.5; 148/172; 357/16; 357/38; 252/62.3 GA
[58] Field of Search ................. 148/171, 172, 33.5; 252/62.3 GA; 357/16, 38

[56] References Cited

U.S. PATENT DOCUMENTS

| 3,560,275 | 2/1971 | Kressel et al. ..................... 148/171 |
| 3,677,836 | 7/1972 | Lorenz ............................... 148/171 |
| 3,752,713 | 8/1973 | Sakuta et al. ...................... 148/171 |
| 3,783,825 | 1/1974 | Kobayashi et al. ............. 148/1.5 X |
| 3,854,447 | 12/1974 | Kobayashi ..................... 148/171 X |
| 3,862,859 | 1/1975 | Ettenberg et al. ......... 252/62.3 GA |

OTHER PUBLICATIONS

IBM Technical Bulletin, Blum et al., "Integrated $Al_x Ga_{1-x}As$ Light–Emitting PNPN Memory Cell," vol. 15, No. 2, (July 1972), p. 470.

*Primary Examiner*—G. Ozaki
*Attorney, Agent, or Firm*—Frank R. Trifari

[57] ABSTRACT

A method of manufacturing a hetero junction by epitaxial deposition in a solution.

The solution contains an amphoteric dopant and the composition thereof is modified at a temperature which lies between the transition temperatures prior to and after the modification.

Application to electroluminescent devices of III and V type.

8 Claims, 4 Drawing Figures

AMPHOTERIC HETEROJUNCTION

The present invention relates to a method of manufacturing a semiconductor device comprising a p-n heterojunction, according to which method an epitaxial layer is deposited on a substrate by cooling a liquid solution.

Certain semiconductor devices, especially electroluminescent devices, are preferably manufactured by liquid phase epitaxy, according to which method the surface of a plate of a semiconductor compound, for example gallium arsenide, is contacted with a liquid solution of this compound, the solvent usually being one of the constituents. The p-n junctions of the device are obtained by doping either with an acceptor element, for example zinc for the compounds of elements of column III and V of the periodic table of elements, or a donor element, for example tellurium, for the same compounds. The p-n junctions can also be obtained by means of an amphoteric doping element, for example silicon for the same III-V compounds. The doping obtained by means of an amphoteric dopant is p or n, in accordance with the temperature of incorporation, or the cooling rate, in the case of an epitaxial deposit.

It is known that, during liquid phase epitaxy with the addition of an amphoteric dopant, the conductivity type of the deposit may vary, for example, from n to p at a given temperature which is termed "transition temperature" and depends inter alia on the cooling rate and the composition of the liquid phase.

At the transition temperature the variation of the distribution coefficient in the deposited crystal, as a function of the temperature, causes a variation in the difference $N_A - N_D$ of the acceptor and donor concentrations. It has been suggested for the manufacture of multi-layer devices to vary the rate at which the temperature of an epitaxial deposition solution decreases, as a function of the desired conductivity type, which method has specially been described in French patent application No. 2,046,941. The cooling rate depends on the thermal balance during operation and the system has a given inertia which prevents it from influencing the cooling rate near the interface between solid and liquid in a sensitive, easy and accurate manner, the more so because an important variation of the cooling rate corresponds to a small difference in transition temperature. These methods require a comparatively high cooling rate which cannot easily be obtained and in particular is difficult to control. In addition, said methods are difficult to apply to hetero structures which are increasingly used, especially in optical electronics, due to the many possibilities they present.

The heterostructures under consideration comprise heterojunctions between materials having different forbidden bandwidths and their manufacture by epitaxial deposition requires certain cooling rates which can hardly be varied in accordance with an extra factor.

It is a special object of the present invention to avoid the drawbacks of the known methods and to provide a method by which in a single epitaxial deposition operation semiconductor devices can be manufactured having n-type and p-type layers.

Another object of the invention is to provide a method which enables the manufacture in one single epitaxial deposition operation of semiconductor devices having heterojunctions.

According to the invention, a method of manufacturing a semiconductor device having a heterojunction, according to which method an epitaxial layer is deposited on a substrate by cooling a liquid solution, is characterized in that the solution comprises an amphoteric doping impurity, the composition of the said solution during cooling is modified at a temperature $T_m$ which is lower than the transition temperature $T_1$, at which transition temperature during cooling a change of conductivity type of the deposit occurs and with the modification of the composition of the solution a change of the conductivity type of the deposit occurs, the composition of the solution after modification determining a new transition temperature $T_2$ which is lower than $T_m$.

Since the temperature $T_m$ at which the modification of the composition of the solution takes place lies between the transition temperatures $T_1$ and $T_2$ which correspond to the compositions prior to and after said modification, the conductivity type of the resulting epitaxial deposit proves to have been modified and changes, for example, from p to n if the junction upon cooling the deposited compound is in the direction from n to p. Since the composition of the solution determines the composition of the deposited layer, the modification of the composition of the solution involves a modification of the composition of the deposit and a heterojunction which corresponds to the instant of modification is obtained near the interface.

The cooling may be continuous, in which case the cooling rate need not be varied during the deposition and the inertia of the system is a control factor of the cooling. Furthermore, even a minimum modification of the composition of the solution involves a noticeable modification of the composition of the deposit and an important modification of the transition temperature.

The method permits obtaining directly, without variation of dopant and in a single epitaxial operation, for example a p-n heterojunction in which the modification of the composition of the epitaxial solution can easily be carried out by means of known liquid phase epitaxy devices comprising a means to add a constituent to the solution during operation.

If the initial cooling temperature after contacting a surface of a substrate with the liquid phase is higher than the transition temperature $T_1$ prior to modifying the composition of the liquid phase, a first transition is obtained which may be a heterojunction, after which the heterojunction according to the invention can be realized by varying the composition of the liquid solution. A substrate may be covered in this manner with three successive layers of alternate conductivity types without the nature of the dopant being varied, which avoids the drawbacks of contamination, diffusion, rupture of the temperature cycles involved during a succession of deposits with different dopants.

If the final temperature of the deposit, for example, during interrupting the contact between the surface of a substrate and the liquid, is lower than the transition temperature $T_2$, after modification of the composition of the liquid phase, another junction is obtained, which may be a "homojunction", above the heterojunction manufactured according to the invention by changing the composition of the liquid solution.

The conductivity types obtained prior to and after transition, prior to and after modification of the composition of the solution, may be p, n $\pi$ compensated with the p-type, $v$ compensated with the $n$ type, in accordance with the concentrations of the amphoteric dopant and those of possible other dopants.

The method according to the invention may be used by means of known amphoteric dopants which are used for liquid phase epitaxy, for example, in an element of column IV of the periodic table of elements, for example silicon, which is introduced into the crystal lattice of a semiconductor compound comprising at least one element of column III of the periodic table of elements and at least one element of column V, for example gallium arsenide. It is known that in sufficiently rapid cooling conditions, an epitaxial deposit of gallium arsenide with a dopant of amphoteric silicon passes from the n-type to the p-type when the temperature passes to 890° C. In addition it is known that in identical cooling conditions an epitaxial deposit of gallium arsenide and aluminium arsenide $Ga_{1-x}Al_xAs$, where $x$ is in the order of 0.4 and which has been obtained from a solution in gallium with a dopant of amphoteric silicon, changes from the n-type to the p-type when the temperature passes to 700° C.

Other dopants may behave analogously to silicon, for example germanium.

During a deposit in the above-described conditions, the necessary aluminum is added to a solution of gallium arsenide in gallium when during the cooling the temperature falls to the value $T_m$ such as $890° > T_m > 700°$, for example, $T_m = 800°$ C. In this manner, the level of the deposit which corresponds to the passage at said temperature, a p-n heterojunction is obtained between gallium arsenide of the p-type and the layer of gallium and aluminum arsenide of the n-type succeeding same immediately.

The method thus permits of using the luminous efficiency of amphoteric silicon by adding to it the amelioration which is due to the confinement effect, and the advantage of a manufacture in one single epitaxial operation with one single dopant.

Actually, the method according to the invention enables the realization of a diode structure confinement effect in which the carriers injected by polarization of a p-n junction are confined in the proximity of the junction due to the forbidden bandwidth difference of the two materials of the structure. The confinement is used especially in electroluminescent diodes where it is possible to obtain very high radiation recombination factors. The method is preferably used to manufacture the electroluminescent device which forms the subject matter of a French patent application filed simultaneously with the present application in the name of applicants under the title: Electroluminescent diode having a confined active region.

The method according to the inventon also permits of realizing matrices of electroluminescent diodes which are integrated in a single crystal and which are insulated from each other by diffused insulation zones. On a substrate, for example of the n-type, a first layer of gallium arsenide of the n-type is thus deposited by means of the method according to the invention, which layer becomes of the p-type at the transition temperature, after which aluminium is added to obtain a surface layer of the n-type and the epitaxy is completed before the deposit becomes of the p-type, Insulation islands are formed by local diffusion of a dopant of the p-type at large depth which reaches the deposited p-type layer. The diodes are then formed in the island by local diffusion of a p-type dopant at a small depth which does not reach the deposited p-type layer.

The method solves the problems which are caused by the difficulty of depositing a p-type layer and then an n-type layer and in addition permits effectively using the presence of the dopant silicon.

Figure 2:
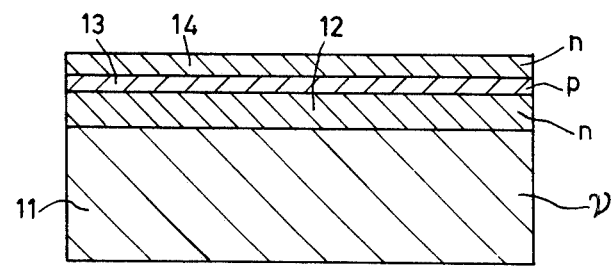
Figure 3:
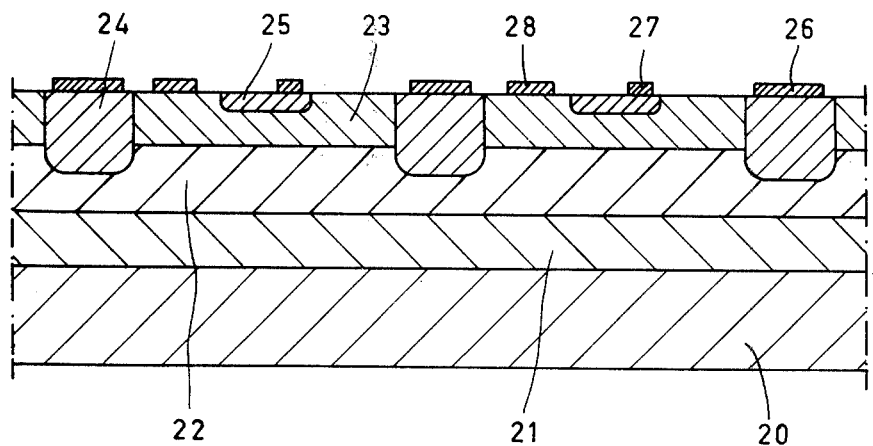
Figure 4:
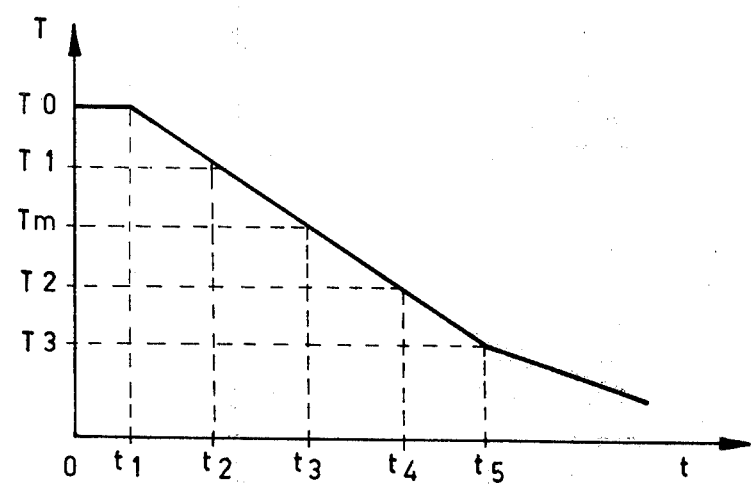

The invention will be described in greater detail with reference to the accompanying drawings, in which:

FIG. 1 is a partial diagrammatic cross-sectional view of a multi-layer device having a hetero-junction realized according to the invention, FIG. 2 is a diagrammatic cross-sectional view of another multi-layer device which also comprises a heterojunction formed according to the invention, FIG. 3 is a partial diagrammatic cross-sectional view of a matrix of diodes manufactured according to the invention, and FIG. 4 shows a graph representing the temperatures T as a function of time $t$ during an epitaxial deposit according to the invention.

The device shown in FIG. 1 is a four-layer device formed on a crystal 1 of gallium arsenide doped to be $n^+$-type conductive. The epitaxial layers deposited successively on the substrate are in this sequence: a layer 2 of silicon-doped n-type gallium arsenide, a layer 3 of silicon-doped p-type gallium arsenide, a layer 4 of silicon-doped n-type gallium and aluminum arsenide, a layer 5 of silicon-doped p-type aluminum gallium arsenide. This device is obtained by means of the following method described with reference to the temperature graph shown in FIG. 4.

The substrate 1 of silicon-doped gallium arsenide having a concentration in the order of $5 \times 10^{17}$ atoms/ccm is placed in a space containing a liquid solution of gallium arsenide in gallium containing 25 g of gallium, 5 g of gallium arsenide and 700 mg of silicon; the substrate 1 and the solution are exposed to an oxygen atmosphere under a pressure in the order of 1 atmosphere and heated at a temperature $T_0$ of 950° C. The substrate and the solution are then contacted at the instant $t_0$ and are maintained in contact at the said temperature $T_0$ for 10 minutes, after which at the instant $t_1$ the temperature of the system is regularly reduced at a rate of 2° per minute, which causes the epitaxial deposit of the layer 2 of n-type gallium arsenide. When the transition temperature $T_1 = 890°$ C at the instant $t_2$, the deposit of the n-type changes into the p-type as a result of a modification in the distribution of the silicon between the arsenic and gallium places of the crystal lattice. After the transition phenomenon, the deposit of the layer 3 of p-type gallium arsenide is obtained. When the temperature does not exceed 800° C = $T_m$ at the instant $t_3$, 25g of aluminum alloyed with 1 g of gallium are added to the solution, which addition is done after a preheating so that the temperature of the solution is not suddenly reduced. The temperature of the solution is then continuously reduced at the same rate as before, which produces the epitaxial deposit of the layer 4 of n-type aluminum gallium arsenide which extends over the preceding deposited layer 3 of p-type gallium arsenide. In this manner a heterojunction has been manufactured by modification of the composition of the epitaxial solution without changing the dopant. When at the instant $t_4$ the temperature $T_2$ becomes equal to approximately 700° C, the deposit changes from the n-type to the p-type as a result of a new modification in the distribution of silicon, the deposit of the layer 5 of p-type aluminum and gallium arsenide being obtained.

At the instant $t_5$ which corresponds to the temperature $T_3$, the deposition is interrupted, for example, by separating the substrate from the solution.

It will be obvious that the epitaxial deposition can be interrupted after depositing the layer 4 when a three-layer-structure is to be obtained.

The structure of the device shown in FIG. 1 may be used, for example, for a thyristor effect.

The same structure but without the fourth layer may be used for the manufacture of an npn transistor. It is then found that if the p-type base of a transistor is formed in this manner, the diffusion length of the carriers is larger than in the transistor having a planar structure and a diffused base, and the gain may be higher with the same base thickness.

The device shown in FIG. 2 is a three layer device which is formed in a gallium arsenide crystal 11 of the semi-insulating type or the weakly doped n-type. Deposited on said substrate is a first epitaxial layer 12 of aluminum gallium arsenide $Al_xGa_{1-x}As$, where $0 < x < 0.2$, which layer is doped with silicon, the deposit being realized by a liquid phase epitaxy from a temperature at which the deposit is of the n-type. During the fall in temperature, after the change to the transition temperature for the composition of the solution used, during which transition the deposit changes from the n-type to the p-type and a layer 13 is formed, a large quantity of aluminum is added so that the transition temperature for a new composition of the solution becomes comparatively low and the deposit changes from the p-type to the n-type and a layer 14 of aluminum gallium arsenide $Al_xGa_{1-x}As$, where $x > 0.2$, is formed on the layer 13.

The device shown in FIG. 3 is a matrix of electroluminescent diodes which are insulated from each other by insulation diffusion. The device is formed in the substrate 20 of n-type gallium arsenide which has a first epitaxial layer 21 of silicon-doped gallium arsenide, also of the n-type, then a second epitaxial layer 22 of silicon-doped gallium arsenide, having a partly compensated p-type, then a third epitaxial layer 23 of silicon-doped gallium aluminium-arsenide of the n-type. Diffused in said latter layer 23 are p-type regions 25 which are zinc-doped for the electroluminescence of the junction between the regions 25 and the layer 23. Regions 24 of the p+-type which are strongly doped with zinc determine with the layer 22 isolation islands which separate the diodes from each other. Contacts 26, 27, 28 are provided on the regions 24, 25 and the layer 23, respectively.

The device shown in FIG. 3 is manufactured by the method according to the invention by the epitaxial deposition of the layers 21, 22, 23 in a single operation from a solution of gallium arsenide in gallium which contains silicon and which experiences a strong temperature fall with the addition of aluminum, after the changed to the transition temperature of the solution prior to the addition of aluminum, but the epitaxy is discontinued before the passage to the transition temperature of the solution after the addition of aluminum.

The invention is not restricted to the examples described. Many types of semiconductor devices can be manufactured by means of the method according to the invention.

For example, by diffusion of a p-type impurity via the n-type layer 14 down into the p-type layer 13 of the structure shown in FIG. 2, a diode may be obtained in which minority charge carriers can be confined in the layer 13 and generated luminescence can be localized. The substrate crystal 11 may then be of the $n^+$-type.

The structure with local emission obtained by said diffusion may be further processed in which the substrate is given the shape of a half sphere to obtain a Weierstrass device or a concave shape, for example, for connection to an optical fibre bundle.

What is claimed is:

1. A method of manufacturing a semiconductor device comprising a p-n heterojunction, according to which method an epitaxial layer is deposited on a substrate by cooling a liquid solution, said solution comprising an amphoteric doping impurity, the composition of the said solution during cooling is modified at a temperature $T_m$ which is lower than the transition temperature $T_1$, at which transition temperature during cooling a change of conductivity type of the deposit occurs and with the modification of the composition of the solution a change of the conductivity type of the deposit occurs, the composition of the solution after modification determining a new transition temperature $T_2$ which is lower than $T_m$.

2. A method as claimed in claim 1, wherein cooling is continued and the cooling rate is constant.

3. A method as claimed in claim 1, wherein the initial cooling temperature is higher than the transition temperature $T_1$ before modification of the compositon of the liquid phase.

4. A method as claimed in claim 1, wherein the final temperature of the deposit is lower than the transition temperature $T_2$ after modification of the composition of the liquid phase 5. A method as claimed in claim 1, wherein said amphoteric dopant is an element of column 1V of the periodic table of elements and said solution consists of a compound having at least one element of column III and one element of column V of the periodic table of elements.

6. A method as claimed in claim 5, wherein said solution consists essentially of gallium arsenide dissolved in gallium, said solution composition being so modified by adding aluminum to said solution at such a temperature $T_m$, where $890° C > T_m > 700° C$.

7. A semiconductor device having a p-n heterojunction, wherein said heterojunction is manufactured by means of a method as claimed in claim 1, in which the two regions on either side of said hetero junction are doped with the same amphoteric impurity.

8. A device as claimed in claim 7, wherein said device comprises a matrix of electroluminescent diodes which are integrated in a single crystal and which are separated from each other by diffused zones, an epitaxial layer which forms the bottom of the isolation islands is a p type-layer which is doped with an amphoteric impurity and an epitaxial layer in which the said diodes are diffused is an n-type layer of a different composition but doped with the same amphoteric impurity.

* * * * *